United States Patent
Hagn et al.

(10) Patent No.: US 6,791,437 B2
(45) Date of Patent: Sep. 14, 2004

(54) SYMMETRIC DUAL MODE SURFACE ACOUSTIC WAVE FILTER HAVING SYMMETRIC HOUSING CONNECTIONS

(75) Inventors: Peter Hagn, Neufinsing (DE); Peter Selmeier, Maitenbeth (DE)

(73) Assignee: EPCOS AG, Munich ( * ) Notice: Subject to any disclaimer, the term of this patent is extended or adjusted under 35 U.S.C. 154(b) by 29 days.

(21) Appl. No.: 10/239,373

(22) PCT Filed: Feb. 20, 2001

(86) PCT No.: PCT/DE01/00653
§ 371 (c)(1),
(2), (4) Date: Feb. 25, 2003

(87) PCT Pub. No.: WO01/71911
PCT Pub. Date: Sep. 27, 2001

(65) Prior Publication Data
US 2003/0160665 A1 Aug. 28, 2003

(30) Foreign Application Priority Data
Mar. 21, 2000 (DE) .......... 100 13 861

(51) Int. Cl.⁷ ............ H03H 9/64
(52) U.S. Cl. ............ 333/195; 333/193; 310/313 D
(58) Field of Search ............ 333/193–196, 333/133; 310/313 B, 313 D

(56) References Cited

U.S. PATENT DOCUMENTS

| | | | | |
|---|---|---|---|---|
| 5,568,002 A | * | 10/1996 | Kawakatsu et al. | 310/313 B |
| 5,835,990 A | * | 11/1998 | Saw et al. | 310/313 D |
| 6,353,372 B1 | * | 3/2002 | Baier et al. | 333/195 |
| 6,469,593 B2 | * | 10/2002 | Nishizawa et al. | 333/133 |
| 6,667,673 B1 | * | 12/2003 | Strauss | 333/195 |
| 6,720,842 B2 | * | 4/2004 | Sawada | 333/133 |

FOREIGN PATENT DOCUMENTS

| | | | |
|---|---|---|---|
| DE | 198 18 826 A1 | | 4/1999 |
| DE | 198 18 826 A1 | * | 11/1999 |
| EP | 0 836 278 | * | 4/1998 |
| EP | 1 239 589 A1 | * | 9/2002 |
| JP | 10-70435 | * | 3/1998 |
| JP | 11-97966 | * | 4/1999 |
| WO | WO97/00556 | | 3/1997 |

OTHER PUBLICATIONS

Endoh et al., "High Performance Balanced Type SAW Filters", 1997 IEEE Ultrasonics Symposium, Oct. 1997.*

* cited by examiner

Primary Examiner—Barbara Summons
(74) Attorney, Agent, or Firm—Fish & Richardson P.C.

(57) ABSTRACT

A DMS filter is proposed with first and second interdigital transducers as a signal input or output that are located between reflector structures, wherein at least one acoustic track has a middle transducer that is split into partial transducers symmetric with respect to the perpendicular to the direction of propagation. The DMS filter is connected in a symmetrical manner to a housing using connection pads or connection pins in order to produce an axis-symmetrical connection layout.

20 Claims, 7 Drawing Sheets

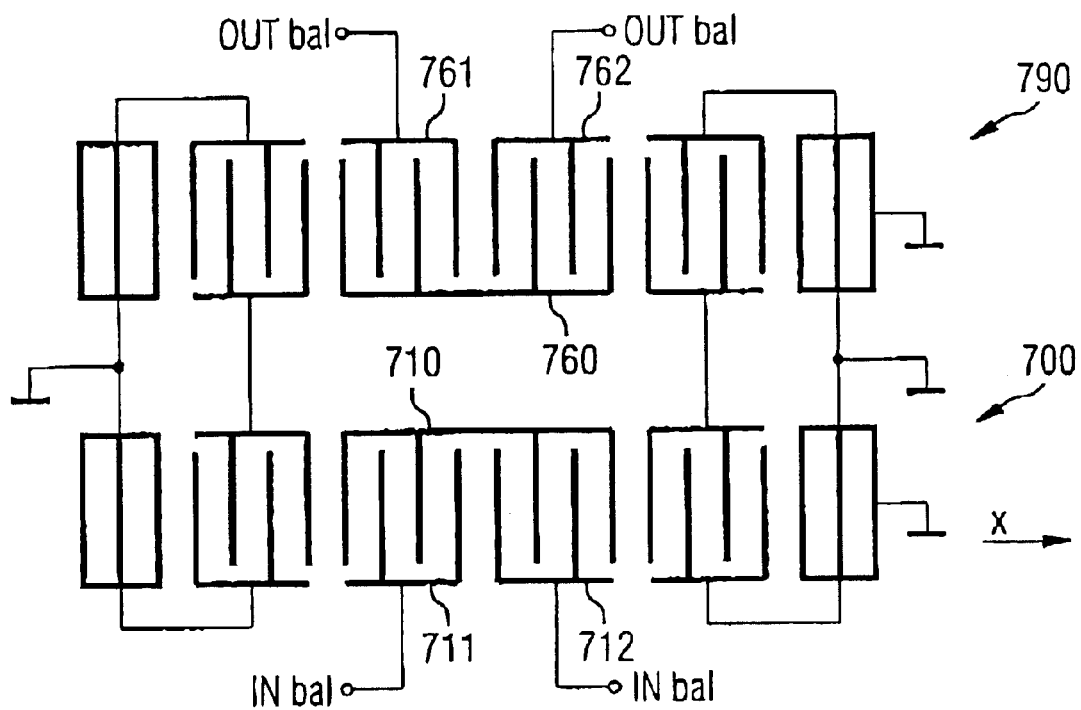
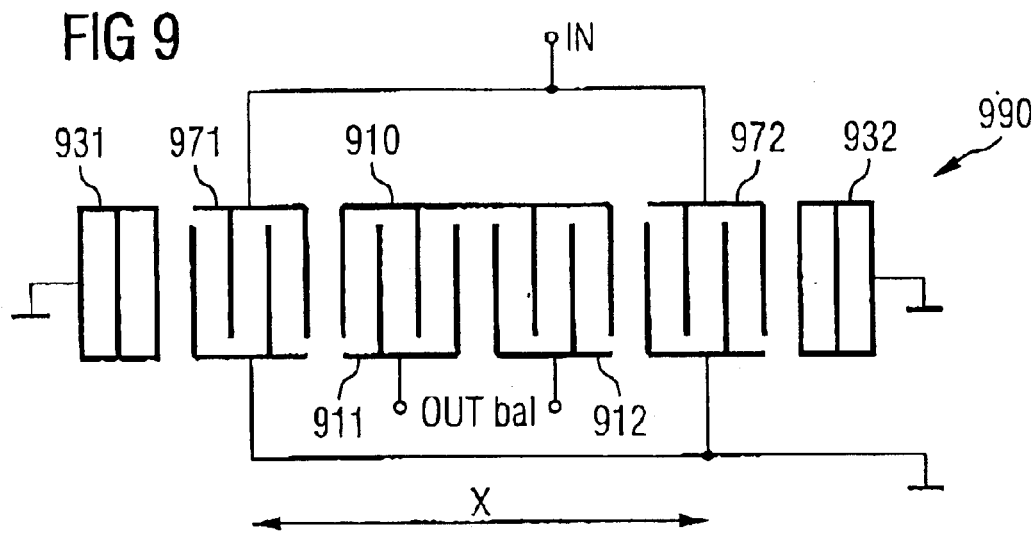

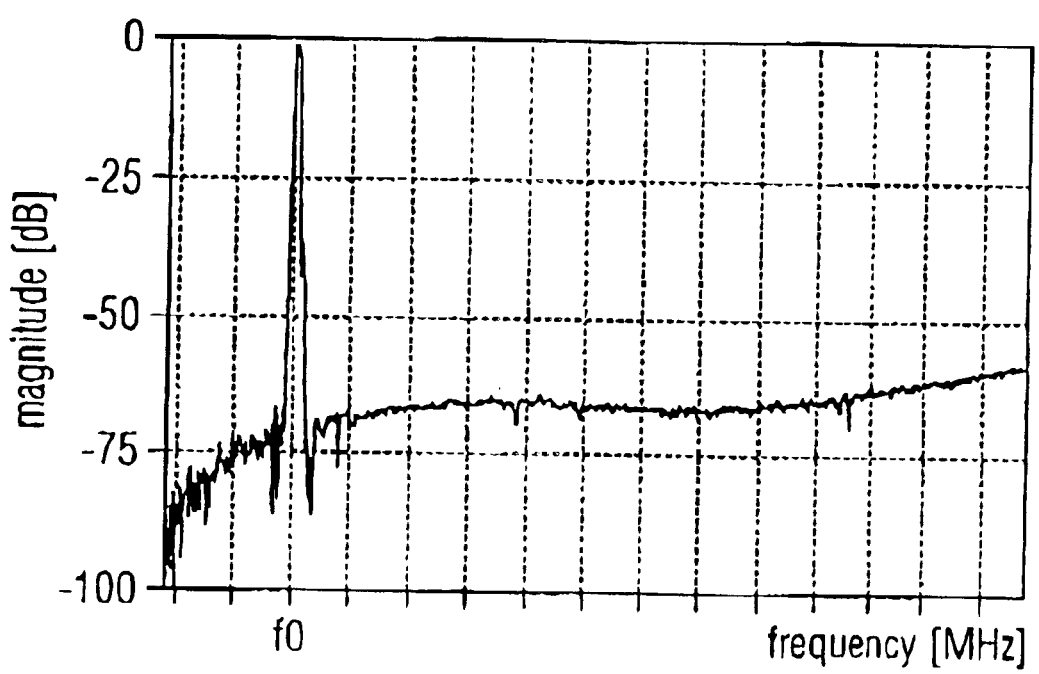

SYMMETRIC DUAL MODE SURFACE ACOUSTIC WAVE FILTER HAVING SYMMETRIC HOUSING CONNECTIONS

CROSS-REFERENCE TO RELATED APPLICATIONS

This application claims priority to PCT Application No. PCT/DE01/00653, filed on Feb. 20, 2001, and to German Patent Application No. 100 13 861.6, filed on Mar. 21, 2000.

BACKGROUND

This invention is directed to a preferably highly selective high frequency surface acoustic wave (SAW) filter of the dual mode type (DMS-SAW filter or DMS filter). The term "longitudinal mode resonator filter" is also used to describe the filter. These DMS filters are used as band pass filters, preferably in cordless or cellular telephones. If a cellular telephone is used as an example, the DMS filters can be located in the HF (high frequency) receiver section or in the transmitter section. For example, in the receiver, DMS filters are positioned between the first low-noise preamplifier (LNA) and a subsequent mixer so that only s filtered signal is converted to the intermediate frequency.

DMS filters are already known, for example, as single-track filters. To provide higher selectivity, filters are also manufactured and used in which two such filter tracks are located on a substrate and combined in a cascaded fashion. DMS filters of this type are known from the European patent document EP-0836278A. FIG. 13 shows a known two-track cascaded filter comprised of two single-track DMS filters connected together.

These embodiments each have resonator/reflector structures at the ends of each respective surface acoustic wave track, and between these at least one interdigital transducer for signal input and at least one for signal output.

FIG. 13 shows a known cascaded filter that includes two acoustic tracks and two single-track filters 1300, 1390 connected together. In this cascaded filter, for example, transducer 1310 is provided as a selective asymmetric/symmetric input to the filter. The connections of the transducer 1360, which is used in this representation as an output, are symmetric outputs (OUT bal and OUT bal). The remaining transducers 1321, 1322, 1371, and 1372 are coupling transducers, as can be seen in the figure, with which the two tracks 1300 and 1390 are electrically coupled together.

As indicated in FIG. 13, these input transducers can be operated symmetrically or asymmetrically, either with a symmetric signal input to both sides (IN bal/IN bal) or an asymmetric input grounded on one side (IN/ground). It should be noted that in a filter of this type, the input and the output can be interchanged or can be used alternatively.

In practice, transducers 1310 and 1360 in FIG. 13 are always designed with mirror-image symmetry about the center plane M, which is perpendicular to the direction of propagation x of the surface acoustic wave. Accordingly, these transducers have an odd number of meshing fingers. In the figure, this involves, for example, five interdigitally arranged fingers on transducers 1310 and 1360.

The foregoing arrangement is preferably used with non-impedance transforming filters. The input impedance is in this case the same as the output impedance, Zin=Zout. Most frequently, the impedance Zin=Zout=50Ω is used.

In the area of application mentioned above as an example, differential mixers with higher impedances are also used (for example, 200Ω). However, if the output of the preamplifier (LNA) is to remain 50Ω, an impedance transforming filter offers an optimum solution to allow tailoring when there is a minimum number of components.

This impedance transformation can—as is known—be produced in two ways.

A) From the article "High Performance Balanced Type SAW Filters", by G. Endoh, M. Ueda, O. Kawachi and Y. Fujiwara, IEEE, Ultrasonics Symposium October 1997, it is known that by shrinking the aperture of the track with the output compared to the aperture of the other track, a higher impedance Zout results. A disadvantage of this solution is an increased insertion loss (compared to similar apertures) due to erroneous internal adjustment of the tracks.

B) In order to attain, for example, a 1:4 impedance transformation in a DMS filter made of four individual tracks, two tracks are connected together in parallel at the input and two tracks are connected together in series at the output. The disadvantage to this is its large, extremely complex layout requiring a very large chip surface, which is thus very expensive to manufacture (many bonding wires).

For use as a common impedance transforming asymmetric/symmetric HF filter that is installed prior to a symmetric mixer, it is critical to maintain the required symmetry in the pass band of the band pass filter. The amplitude symmetry of the two output signals a1 and a2, defined as Δampl.=ampl.(a1)−ampl.(a2), must not be more than ±1.0 dB (decibels):

$$\Delta ampl. \leq \pm 1.0 \text{ dB}$$

Likewise, the phase symmetry of the two output signals a1 and a2, defined as Δø−180° with Δø=ø(a1)−ø(a2), must be below 10° in the pass band:

$$\Delta\varnothing - 180° \leq \pm 10°$$

Another characteristic of symmetric filters is their high stop-band attenuation. In the ideal case, the two symmetric signals are in phase and of equal magnitude outside the pass band. Any deviation from this ideal case leads to a reduction in the signal suppression. An undesirable residual signal is the result, i.e., the filter has a lower stop-band attenuation (=selection outside of the pass band).

SUMMARY

The object of this invention is to produce a filter that has improved symmetry characteristics in the pass band for operation as an asymmetric/symmetric or symmetric/symmetric filter without increasing the required circuitry or the required chip surface.

This object is met by a SAW filter according to claim 1. Advantageous embodiments of the invention can be found in the dependent claims.

This invention is based on a DMS filter with at least one track on a piezoelectric substrate with an odd number of first interdigital transducers and an even number of second interdigital transducers that are connected to the input and the output of the filter and are arranged between reflector structures. In at least one acoustic track, the middle transducer is split symmetrically into partial transducers with respect to the perpendicular of the direction of propagation of the surface acoustic wave, which leads to an even number of electrode fingers for this middle transducer. In addition, the filter is connected in a symmetrical manner to the connection pads or connection pins of a housing so as to provide an axis-symmetrical connection layout.

It is the splitting of the middle transducer, i.e., the transducer among the odd number of first interdigital transducers that is located in the middle of the track, that allows an axis-symmetrical connection to the connections of the housing, which in turn are also arranged axis-symmetrically.

By increasing the geometric symmetry, the symmetry of the transmission behavior of the filter is also improved in the pass band for the following three cases: an impedance transforming asymmetric/symmetric filter, an impedance transforming symmetric/symmetric filter, and a non-impedance transforming symmetric/symmetric filter.

It is also possible to split the middle transducer symmetrically into partial transducers in at least two acoustic tracks. In the process, the sum of the number of fingers of the split partial transducers located in one acoustic track is even, whereas the number of fingers of each partial transducer can be even or odd. Preferably, in cascaded multi-track filters according to the invention, the two outer tracks that are connected to the input or output have split middle transducers. In a filter operated in symmetric/symmetric mode, this leads to a further improvement in the transmission behavior.

Also advantageous to symmetric transmission behavior is if the housing is connected by means of bump connections. This prevents asymmetries caused by parasitic capacitances and inductivities that can result from what are often different lengths of bonding wires. This is practically unavoidable in wire bonding. The result is that the filter is preferred to be installed in the housing using flip chip technology. Bump connections can be produced more regularly and produce fundamentally fewer parasitic capacitances and inductivities.

It is also advantageous if non-split middle transducers or other interdigital transducers have an even number of electrode fingers.

In the asymmetric/symmetric operation of the filter, the asymmetric gate (input or output) has a single signal-carrying connection and an associated ground connection. The symmetric gate has two signal-carrying connections. An ideal symmetric housing with five connections (three of these being signal-carrying connections) is advantageous for this purpose, with the connection pad for the signal-carrying connection lying on the asymmetrical gate on the axis of symmetry and the connection pad for the connection pair lying at the symmetric gate and the pad for ground being symmetric with respect to the axis of symmetry. Two ground connections have the advantage in that the ground connection from the chip to the housing and to the outside can also be designed symmetrically.

In symmetric/symmetric operation of the filter with pairs of connections, an ideal symmetric housing with six connections is advantageous, with two connection pads each being arranged symmetrically with respect to the axis of symmetry for ground, the input, and the output.

It is preferable to arrange the connection pads for ground between the connection pads for input and output. This allows a better capacitive separation, thus reducing any undesirable coupling of input and output (direct cross-talk).

In one embodiment of the invention, the connection pads for ground are combined into a common pad that is symmetric with respect to the axis of symmetry.

To tailor it to a particular circuit environment, the filter can be impedance-adjusted and, in particular, impedance transforming. These measures can be undertaken in a filter according to the invention in a known manner. It is preferable for the impedance transformation factor to be 1:4. In using different apertures in the two tracks (see embodiment A), it is also possible to use modified impedance transformation factors, but the insertion loss increases in this case as already mentioned.

The invention is explained below in more detail with the help of exemplary embodiments and 14 figures associated therewith. These show the following in partially schematic and non-scaled representation:

DESCRTIPTION OF THE DRAWINGS

FIG. 7 shows a non-impedance transformed filter in symmetric/symmetric operating mode.

FIG. 9 shows a filter according to the invention in asymmetric/symmetric operating mode with one DMS track.

FIG. 14 shows a pass band curve of a filter according to the invention.

DETAILED DESCRIPTION

Figure 1:
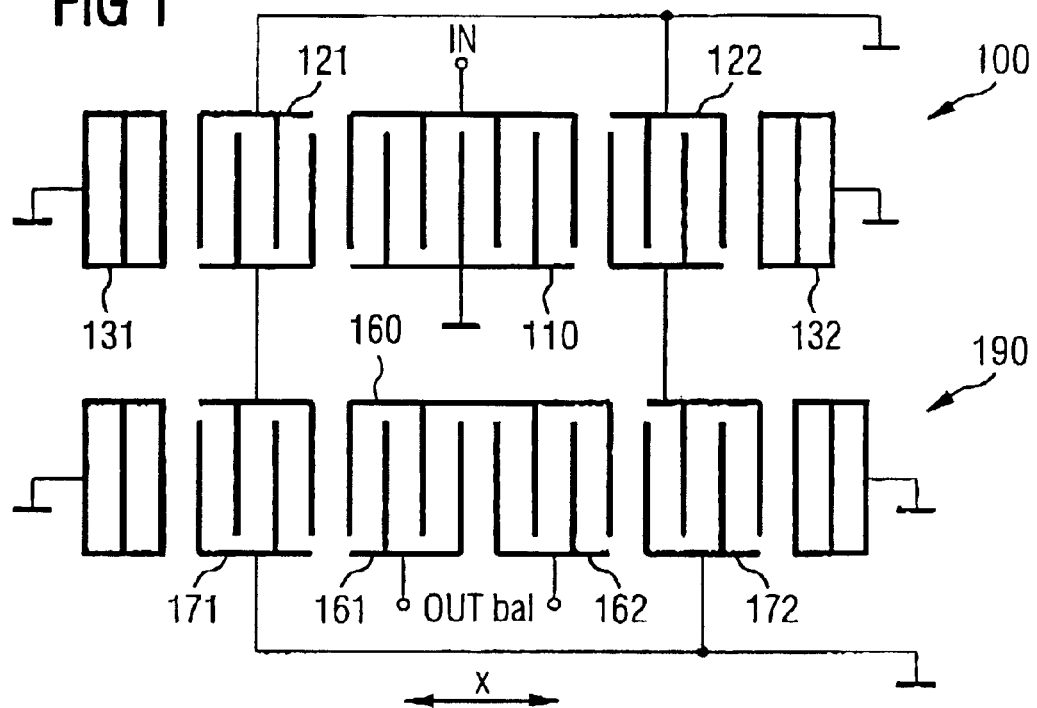
FIG. 1 shows an impedance transformed filter according to the present invention in asymmetric/symmetric operating mode.

FIG. 9 shows the invention conceptually using a DMS track 990 with a first middle transducer 910 that serves as the output, which is split into two partial transducers 911, 912, and two second transducers 971, 972 serving as the input. The transducers are bordered on both sides in the track by reflectors 931, 932. The axis of symmetry M is perpendicular to the direction of propagation x of the surface acoustic wave (SAW) and divides the middle transducer 910, which is a first interdigital transducer, symmetrically. The structure shown can serve as a filter by itself, but is preferred to be cascaded with at least one other DMS track. In the process, the outputs of the first or second track can be connected to the inputs of the second or first track. In general, inputs and outputs can also be interchanged. Thus the filter can operate in either direction. It is also possible to insert other elements in series with the inputs or outputs, such as resonators. These types of preferred multi-track DMS filters are described in the following exemplary embodiments.

EXAMPLE 1

Figure 2:
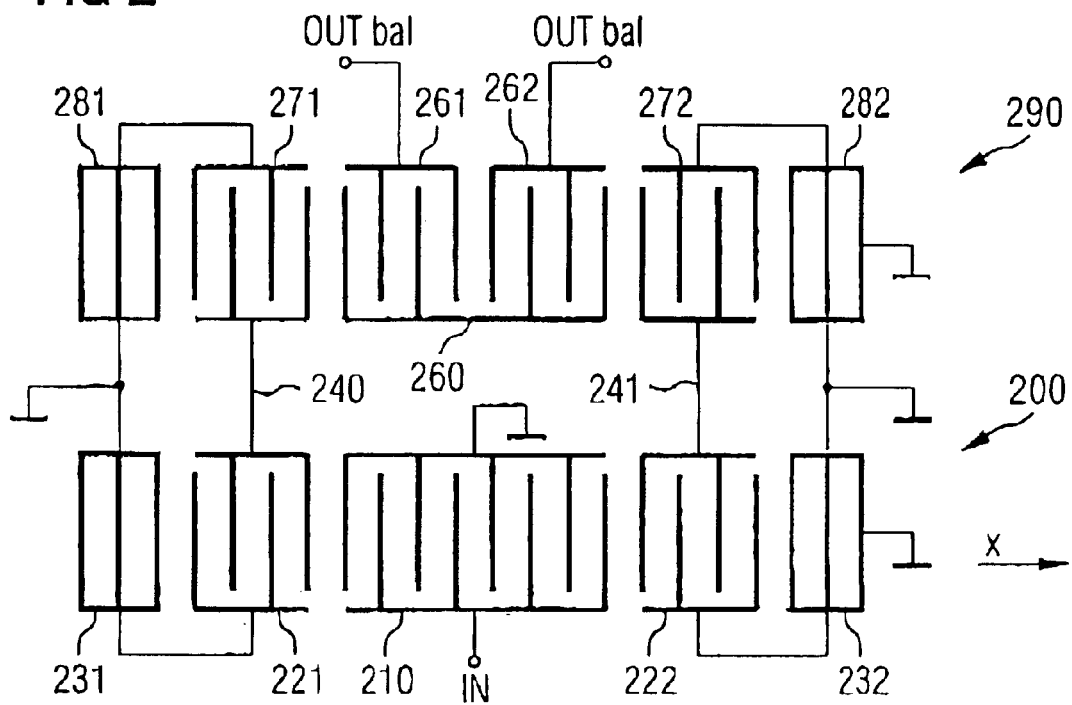
FIG. 2 shows a variant of FIG. 1 with a different number of electrode fingers.

Impedance Transforming Asymmetric/Symmetric Filter with Improved Symmetry in the Pass Band (FIGS. 1 and 2)

FIG. 1 illustrates the principle of the V-split, so-named because of its shape. The output transducer 160 is split into two partial transducers 161 and 162. These two partial transducers 161 and 162 are electrically connected such that a series circuit arises for the partial transducers with regard to filter output connections. This results in a multiplication of the resulting impedance, since both halving the transducer as well as the series circuit itself each result in a doubling of the impedance. The position of the connections enables a symmetric connection and installation in a symmetric housing. The axis of symmetry (not shown) is perpendicular to the direction of propagation x of the surface acoustic wave and divides the two middle transducers 110 and 160 symmetrically.

In FIG. 2, a variant of FIG. 1 is shown in which an even number of fingers for the middle transducer 210 is used on the asymmetric side. In the output track, the coupling transducer 271 is folded around the axis x in which the wave propagation takes place. This means that all four coupling transducers (221, 222, 271, 272) have the same direction toward the middle transducer 210 or 260, with the first finger closest to the middle transducer. In the example shown, the embodiment is selected such that these first fingers are connected to the coupling pads 240 and 241 between the tracks.

The number of fingers in the coupling transducers (221, 222, 271, 272) can be even or odd. In the arrangement shown, the coupling between the tracks takes place in a push-pull arrangement, i.e., with opposite phase positions in the coupling pads 240 and 241. The number of fingers in the split partial transducers 261 and 262 in track 290 is usually equal to half the number of fingers in the middle transducer 210 of track 200. The number of fingers in input transducer 210 is even in this embodiment.

The coupling transducers 221, 222, 271, 272 can be connected to ground on the outer side that is not connected to a coupling pad 240, 241. It is, however, also possible to connect the coupling transducers of two adjacent tracks neighboring one another on the outer side.

The reflectors (231, 232, 281, 282) at the tracks can be designed with a floating potential or can be connected to ground. It is also possible, as shown, to connect the reflectors to a connection on the outer adjacent coupling transducer. The connection can also be made, in contrast to FIG. 2, such that the reflector is at the exact opposite potential as the last adjacent transducer finger.

The input and output can be interchanged with respect to the arrangement of acoustic tracks, which also applies to all filters according to the invention.

Figure 3:
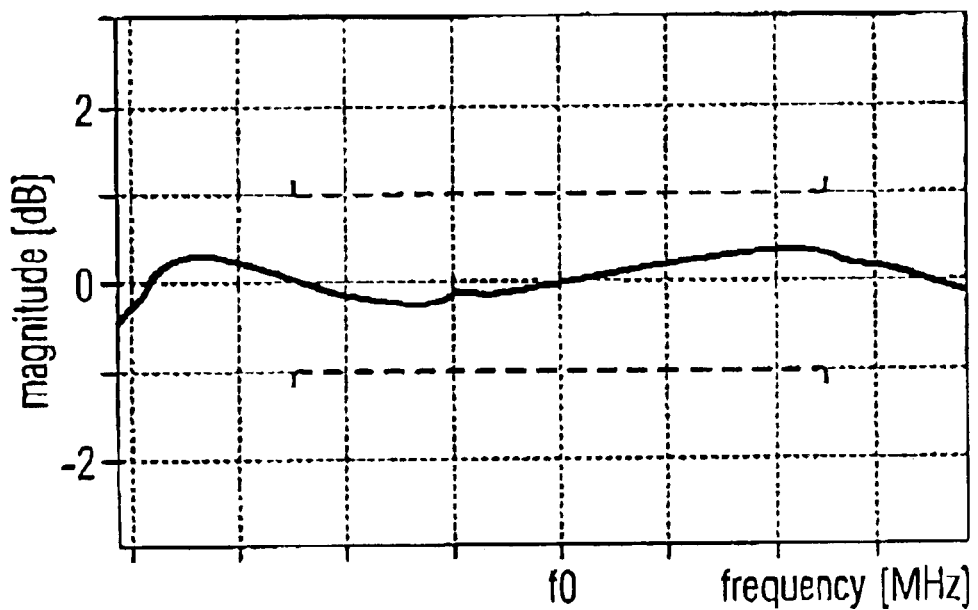
FIG. 3 shows the measurement curve for the amplitude symmetry of a filter according to FIG. 2.
Figure 4:
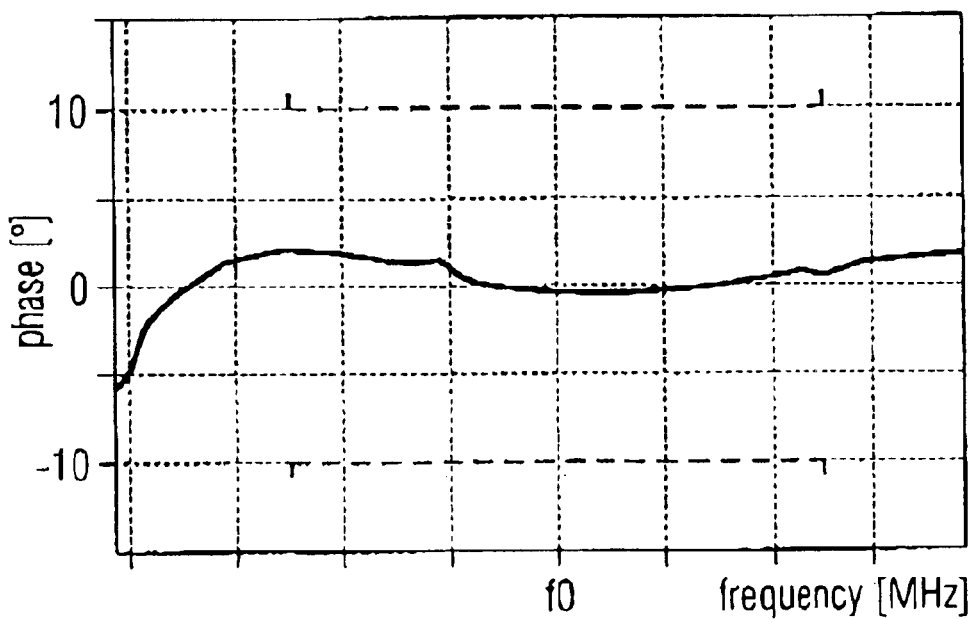
FIG. 4 shows the measurement curve for the phase symmetry of a filter according to FIG. 2.

By means of the filter arrangement according to FIG. 2, the symmetry in the pass band is significantly improved in comparison with the prior art arrangements. The typical amplitude symmetry value decreases in the process to typically ±0.3 dB and the phase symmetry value decreases to typically ±0.2°. The symmetry behavior of this filter is shown in FIG. 3 with respect to amplitude symmetry and in FIG. 4 with respect to phase symmetry. The difference of each of the two signals a1 and a2 is plotted against the frequency f.

EXAMPLE 2

Figure 5:
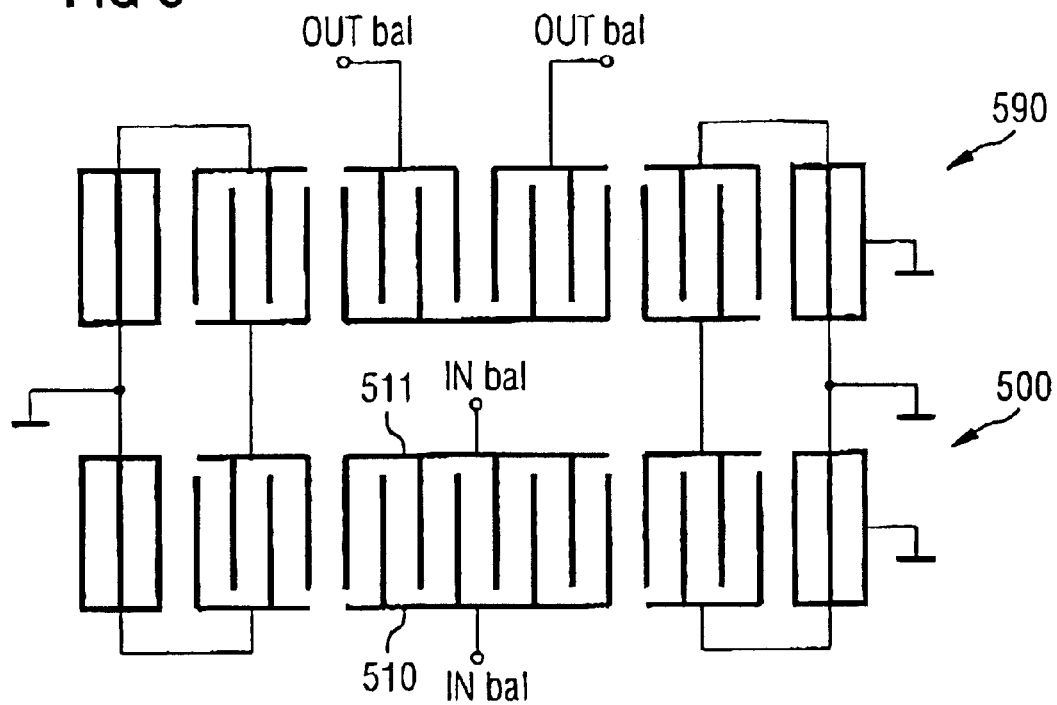
FIG. 5 shows an impedance transformed filter in symmetric/symmetric operating mode.

Impedance Transforming Symmetric/Symmetric Filter (FIG. 5)

FIG. 5 is identical to Example 1 with regard to its layout arrangement, up to the second isolated connection 511 of the middle transducer 510 of the input track. This is not grounded, in contrast to Example 1, but serves as a second connection for the symmetric signal on the low-impedance (ohm) side of the filter. The improvement of symmetry in the pass band is comparable to the results in Example 1.

EXAMPLE 3

Figure 6:
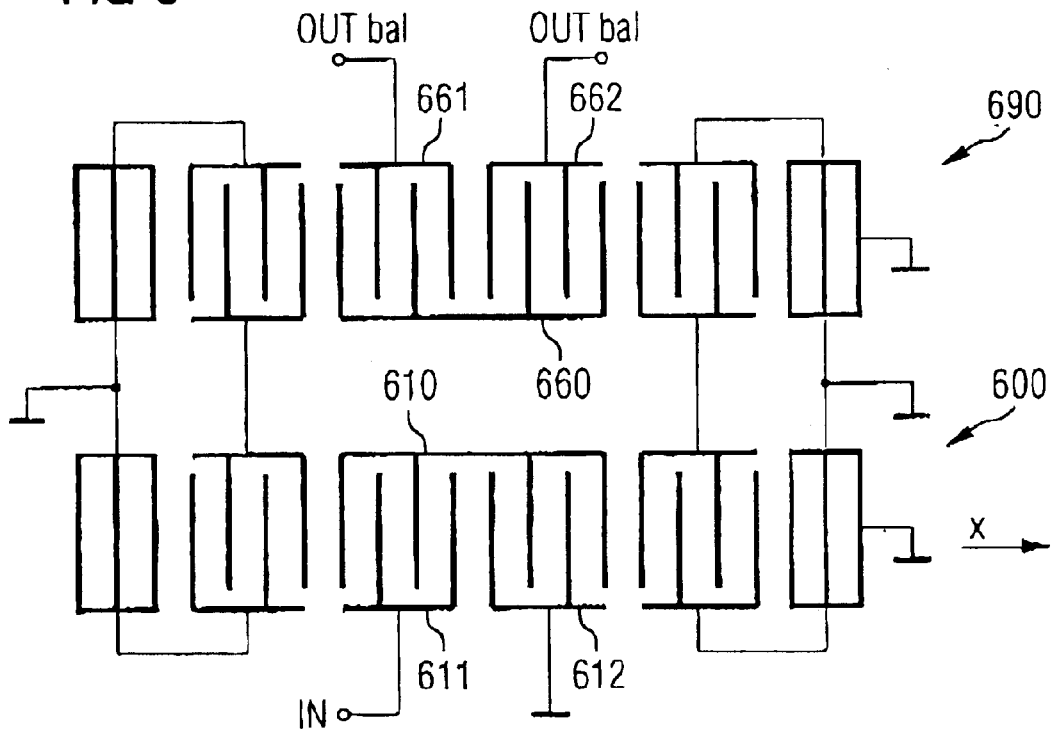
FIG. 6 shows a non-impedance transformed filter in asymmetric/symmetric operating mode.

Non-Impedance Transforming Asymmetric/Symmetric Filter (FIG. 6)

In this embodiment, the middle transducers 610 and 660 of the two tracks are divided and connected in series, but operate symmetrically in only one track. In the second track, one of the two partial transducers is provided with the signal and the second partial transducer is grounded, thus causing the track to operate asymmetrically.

EXAMPLE 4

Non-Impedance Transforming Symmetric/Symmetric Filter (FIG. 7)

In a fourth embodiment, the middle transducer 710 and 760 is divided in both tracks and connected in series. This allows symmetric filters to be operated on both sides with high selection, preferably without an impedance transforming effect.

Through a difference in the apertures of the two tracks 600/690, and 700/790, Examples 3 and 4 can also be converted into impedance transforming filters.

By means of the nearly identical signals from input to output in the ideal case, very high selections can be achieved, especially for Examples 1 and 4. In the pass band, the even more symmetric control of the split partial transducer leads to the desired improvement in amplitude and phase symmetry (see FIGS. 3 and 4).

Amplitude difference: <±0.3 dB typically

Phase difference: <±0.2° typically

The improvement in symmetry of the acoustic tracks according to Examples 1 to 4 is also an advantage for the stop band: the attenuation in the stop band is increased by means of the improved suppression of the symmetric signals, which is supported by the selection of an appropriately symmetric housing.

Below, the housing and connection techniques are described for Examples 1 to 4, which are tailored accordingly.

EXAMPLE 5

Figure 8:
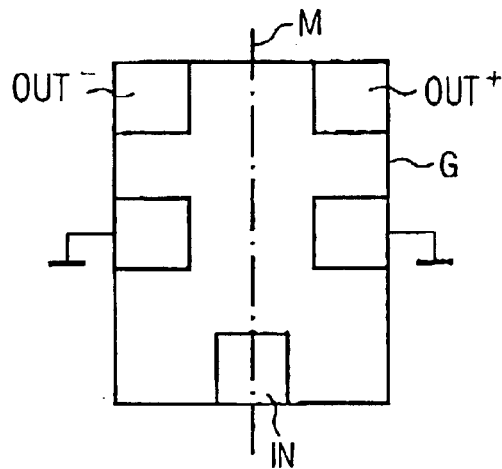
FIG. 8 shows a housing with a symmetric connection sequence.

Housing for Impedance Transforming Asymmetric/Symmetric Filters (FIG. 8)

A DMS filter according to FIG. 2 is comprised of two acoustic tracks 200 and 290. The input track is connected asymmetrically and the output track is connected symmetrically. The two tracks are arranged parallel and the axis of symmetry is perpendicular to the direction x of propagation of the two tracks. The two connections of the input track (IN and ground) lie on the axis of symmetry M. The two symmetrical connections of the output track (OUT bal) lie symmetric to the axis of symmetry, which is possible by using a V-split transducer according to the invention. In order to obtain a maximally good decoupling between input and output signals, the ground pad of the input transducer is placed between the two acoustic tracks on the input track, and the pad of the hot input signal (IN) is oriented outward. This maximizes the distance of the signal pads from input and output in relation to the chip size and the ground surface between the acoustic tracks produces a further decoupling of the signals. A ground connection of the reflectors can also be made between the acoustic tracks.

The housing G is now laid out in a corresponding fashion (see FIG. 8), i.e., the input solder pad (IN) lies on the axis of symmetry at one end of the housing and the output solder pads (OUT− and OUT+) lie symmetric to the axis of symmetry M at the other end of the housing. Arranged in the middle are ground solder pads. The internal housing circuitry is also designed to be absolutely symmetrical so that an overall ideal symmetric layout is attained. Thus, three factors combine, according to the invention, to effect a good stop-band attenuation in the filter, which are effective in and of themselves but mainly because of their synergistic effect:

absolute symmetry of the chip layout absolute symmetry of the housing layout maximum decoupling between input and output by means of the ground lying between them both on the chip as well as in the housing.

FIG. 14 shows the measured transmission function of a filter at ca 1 GHz, which had been implemented in a corresponding housing. The stop-band attenuation is typically >65 dB above the pass band.

The symmetry in the pass band is improved even more by an ideal symmetric housing due to reductions in inductivity, and are even and very reproducible in the symmetric paths, thanks to the bump connections. The symmetric signal, which is very purely produced acoustically, has practically no symmetric disturbances along its path on the chip and through the housing.

Figure 10:
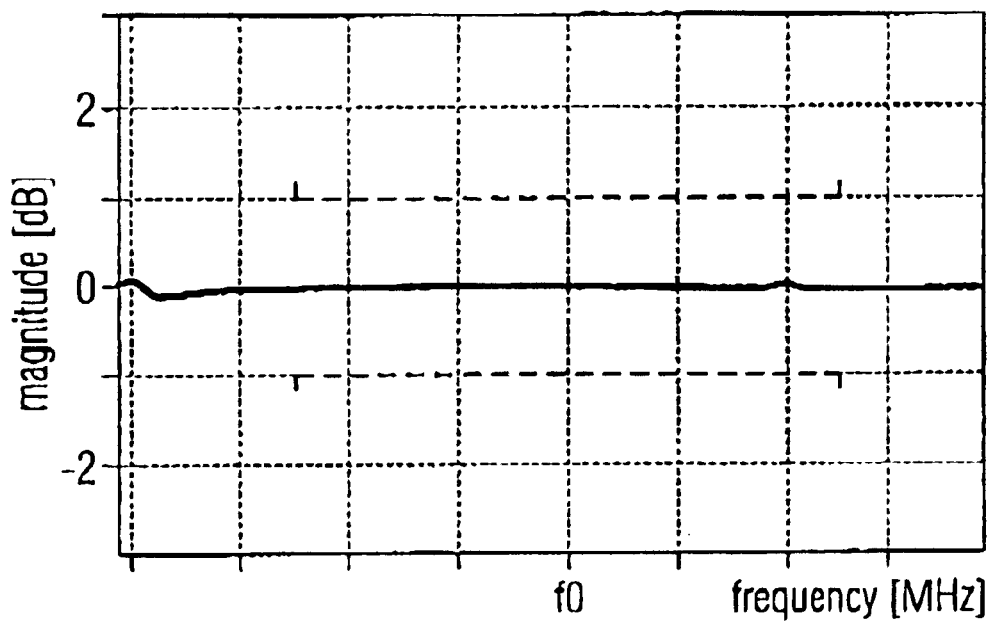
FIG. 10 shows a measurement curve for the amplitude symmetry of a filter in the housing according to the invention.
Figure 11:
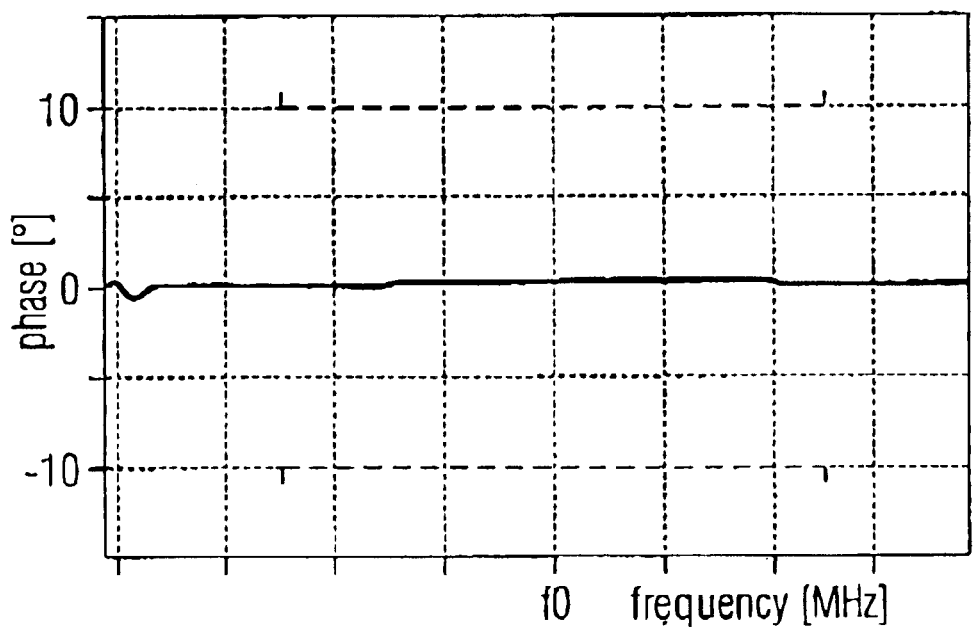
FIG. 11 shows a corresponding measurement curve for the phase symmetry.

FIGS. 10 and 11 show the nearly undisturbed symmetry in the pass band of a DMS filter that has an improved symmetry in the acoustic tracks according to the invention, and that had been installed into the 5-pin housing just described. This combination attains a typical amplitude symmetry (FIG. 10) of $$\Delta ampl. \leq 0.1 \text{ dB}$$

and a typical phase symmetry (FIG. 11) of $$\Delta j - 180° \leq \pm 0.5°.$$

EXAMPLE 6

Figure 12:
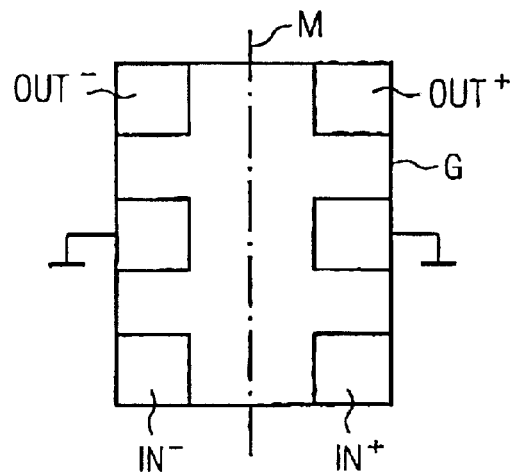
FIG. 12 shows a housing with a symmetric connection sequence.
Figure 13:
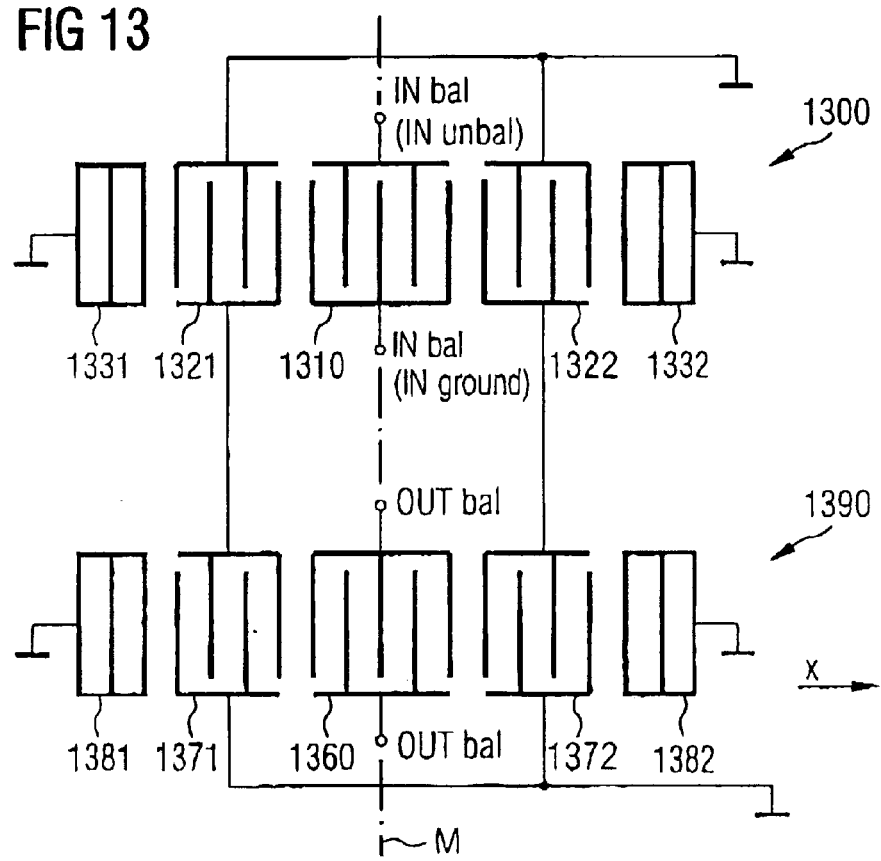
FIG. 13 shows a known 2-track DMS filter.

Housing for Non-Impedance Transforming Symmetric/Symmetric Filters (FIG. 12)

The two tracks of a DMS filter, for example a filter according to FIG. 7, are arranged parallel and the axis of symmetry M lies perpendicular to the direction of propagation x of the two tracks. The two symmetric connections of the input track (IN bal) also lie symmetric with respect to the axis of symmetry in the same way as the two symmetric connections of the output track (OUT bal), by means of the dual use of a V-split. In order to obtain maximally good decoupling between input and output signal, the ground connection for the reflectors is placed between the two acoustic tracks and each of the pads of the hot input and output signals are oriented outward. This maximizes the distance of the signal pads from input and output with respect to the chip size and the ground surface between the acoustic tracks produces a further decoupling of the signals.

The housing G is laid out in a corresponding manner, i.e., the input solder pads (IN− and IN+) lie symmetric to the axis of symmetry M at one end of the housing and the output solder pads (OUT− and OUT+) lie symmetric to the axis of symmetry at the other end of the housing. Arranged in the middle are ground solder pads. The internal housing circuitry is also designed to be absolutely symmetrical so that the filter and the housing together result in an ideal overall symmetric layout with correspondingly good results.

Another cause for asymmetries can be in manufacturing deviations in electrical connections, since it is practically impossible to avoid with bonding wires (with different lengths). For this reason, it is preferable to use bump technology in the housing in versions 5 and 6 as a connection technique. Their inductivities are very small and also very reproducible. In the process, the chip is soldered to the housing head first using so-called bumps or solder balls. In this way, the asymmetries due to the deviations in connection inductivities are reduced to a minimum or can be dispensed with altogether.

What is claimed is:

1. A surface acoustic wave (SAW) filter, comprising:

an acoustic track on a piezoelectric substrate;

a number n of first interdigital transducers to input or output a signal and n+1 second interdigital transducers to output or input a signal, the first and second interdigital transducers being located between at least two reflector structures that border the acoustic track, the first interdigital transducers including a middle transducer that as split into partial transducers that are symmetric with respect to a perpendicular to a direction of propagation of a surface acoustic wave through the surface acoustic wave filter; and a housing having connections to input or output a signal via the first and second interdigital transducers, the connections being symmetric with respect to the perpendicular to produces an axis-symmetrical connection layout.

2. A SAW filter according to claim 1, wherein the SAW filter comprises at least two acoustic tracks on the piezoelectric substrate, the at least two acoustic tracks each having a number n of first interdigital transducers to input or output a signal and n+1 second interdigital transducers to act as coupling transducers, the first and second interdigital transducers being located between the at least two reflector structures.

3. A SAW filter according to claim 2, wherein the middle transducer includes a number of fingers, a total number of fingers of each partial transducer located in each acoustic track is even, and the number of fingers of each partial transducer is even or odd.

4. A SAW filter according to claim 1, wherein a connection between the first and second interdigital transducers and the housing includes a bump connection.

5. A SAW filter according to claim 1, wherein the first and second interdigital transducers are installed in the housing using flip chip technology.

6. A SAW filter according to claim 1, wherein the second interdigital transducers have an even number of electrode fingers.

7. A SAW filter according to claim 1, wherein the acoustic track has only one middle transducer that is split into two partial transducers, two coupling transducers, and at least one reflector structure at each end.

8. A SAW filter according to claim 1, wherein non-split first interdigital transducers have an even number of electrode fingers.

9. A SAW filter according to claim 1, wherein the housing comprises an ideally symmetric housing with five connections, and wherein a connection pad for an input is on the perpendicular and connection pads for an output and for ground are symmetric with respect to the perpendicular.

10. A SAW filter according to claim 1, wherein the housing comprises an ideally symmetric housing with six connections, and wherein connection pads for ground are arranged symmetric with respect to the perpendicular.

11. A SAW filter according to claim 9, wherein the connections comprise two ground solder pads combined into a common pad that is symmetric with respect to the perpendicular.

12. A SAW filter according to claim 11, wherein the ground solder pads are arranged between the input and the output pads.

13. A SAW filter according to claim 1, the SAW filter having a size that is less than or equal to 3.0×3.0 mm².

14. A SAW filter according to claim 1, SAW filter having a size that is less than or equal to 2.0×2.5 mm².

15. A SAW filter according to claim 1, wherein the SAW filter has an impedance transformation.

16. A SAW filter according to clown 15, wherein the impedance transformation has a ratio of 1:4.

17. A SAW filter according to claim 15 having an impedance transformation of 50/150Ω or 50/200Ω.

18. A SAW filter according to claim 1, that is terminated with an impedance of 200/200Ω.

19. A SAW filter according to claim 1 that is operable in an asymmetric/symmetric operating mode.

20. A SAW filter according to claim 1 that is operable in a symmetric/symmetric operating mode.

* * * * *

UNITED STATES PATENT AND TRADEMARK OFFICE
CERTIFICATE OF CORRECTION

PATENT NO. : 6,791,437 B2
DATED : September 14, 2004
INVENTOR(S) : Peter Hagn and Peter Selmeier It is certified that error appears in the above-identified patent and that said Letters Patent is hereby corrected as shown below:

<u>Column 8,</u>
Line 25, change the word "as" to -- is --.
Line 32, replace "produces" with -- produce --.

Signed and Sealed this

Second Day of August, 2005

JON W. DUDAS
*Director of the United States Patent and Trademark Office*